United States Patent
Rangarajan et al.

(10) Patent No.: US 6,879,406 B1
(45) Date of Patent: Apr. 12, 2005

(54) USE OF SCATTEROMETRY AS A CONTROL TOOL IN THE MANUFACTURE OF EXTREME UV MASKS

(75) Inventors: Bharath Rangarajan, Sunnyvale, CA (US); Ramkumar Subramanian, Sunnyvale, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/677,041

(22) Filed: Oct. 1, 2003

(51) Int. Cl.[7] ............................................. G01B 11/24
(52) U.S. Cl. ...................... 356/625; 250/559.44; 430/5
(58) Field of Search ........................... 356/237.1–237.6, 356/625, 394; 250/559.4, 559.41, 559.42, 559.43, 559.44; 430/5, 311–313, 396

(56) References Cited

U.S. PATENT DOCUMENTS

| | | | | |
|---|---|---|---|---|
| 6,013,399 A | * | 1/2000 | Nguyen | 430/5 |
| 6,042,995 A | * | 3/2000 | White | 430/311 |
| 6,327,033 B1 | * | 12/2001 | Ferguson et al. | 359/394 |
| 6,608,321 B1 | * | 8/2003 | La Fontaine et al. | 250/559.44 |
| 6,654,660 B1 | * | 11/2003 | Singh et al. | 700/121 |
| 6,673,520 B2 | * | 1/2004 | Han et al. | 430/313 |
| 6,738,135 B1 | * | 5/2004 | Underwood et al. | 356/237.5 |

* cited by examiner

Primary Examiner—Samuel A. Turner
Assistant Examiner—Sang H. Nguyen
(74) Attorney, Agent, or Firm—Amin & Turocy, LLP

(57) ABSTRACT

One aspect of the present invention relates to a system and method for controlling an EUV mask fabrication process using a scatterometer. The system includes an EUV mask fabrication system comprising a translucent substrate having one or more layers of reflective material formed thereon and a patterned photoresist layer as the uppermost layer, a mask inspection system operatively connected to the mask fabrication system for examining the layers as they are being etched and developed by the mask fabrication system and generating data related thereto, and an EUV mask fabrication control system coupled to the mask inspection system for receiving data from the inspection system in order to regulate the mask fabrication system to facilitate obtaining desired critical dimensions. The method involves monitoring the etching of the features, generating data related to the features, and relaying the data to a control system to optimize the EUV mask fabrication process.

22 Claims, 6 Drawing Sheets

US 6,879,406 B1

USE OF SCATTEROMETRY AS A CONTROL TOOL IN THE MANUFACTURE OF EXTREME UV MASKS

TECHNICAL FIELD

The present invention generally relates to processing a semiconductor substrate. In particular, the present invention relates to monitoring an extreme ultraviolet (UV) mask fabrication process via scatterometry.

BACKGROUND ART

Achieving the objectives of miniaturization and higher packing densities continue to drive the semiconductor manufacturing industry toward improving semiconductor processing in every aspect of the fabrication process. Several factors and variables are involved in the fabrication process. For example, at least one and typically more than one photolithography process may be employed during the fabrication of a semiconductor device. Each factor and variable implemented during fabrication must be considered and improved in order to achieve the higher packing densities and smaller, more precisely formed semiconductor structures.

In general, lithography refers to processes for pattern transfer between various media. It is a technique used for integrated circuit fabrication in which a silicon slice, the wafer, is coated uniformly with a radiation-sensitive film, the photoresist, and an exposing source (such as optical light, X-rays, or an electron beam) illuminates selected areas of the surface through an intervening master template, the photoresist mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photoresist mask causes a chemical transformation in the exposed areas of the coating thereby making the image area either more or less soluble (depending on the coating) in a particular solvent developer. The more soluble areas are removed in the developing process to leave the pattern image in the coating as less soluble polymer. The resulting pattern image in the coating, or layer, may be at least one portion of a semiconductor device that contributes to the overall structure and function of the device.

With the advancement of semiconductor fabrication techniques toward smaller, more densely packed features comes increased demands for processing with shorter wavelengths of light and thinner photoresist materials. For example, in order to achieve smaller feature dimensions, wavelengths in the extreme ultraviolet (EUV) range of about 5 to about 25 nm are being employed in association with EUV masks. Such EUV masks can then be used to transfer images to underlying layers of material to form structures characterized by smaller dimensions.

Typically, chrome and nitride are used to form EUV masks. However, these are reflective materials and thus, are more difficult to produce precisely sized as well as smaller sized features therein. As a result, maintaining the precision and accuracy as well as achieving the smaller size dimensions are critical in the manufacture of EUV masks.

Conventional control methods are typically limited to end-point techniques where by inspection of the mask occurs only after the EUV mask has been fully made. These methods are often slow, inefficient and costly and not practical for the current performance demands and high quality standards of today's users and consumers.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides a system and method for controlling an EUV mask fabrication process in order to facilitate obtaining desired critical dimensions on a fabricated EUV mask. More specifically, the present invention involves monitoring the formation of an EUV mask and communicating information about the formation of the mask to the mask fabrication components in order to improve the fabrication of the EUV mask as well as to improve the fabrication of future EUV masks.

This monitoring is accomplished in part by employing an optical measurement system. The optical measurement system comprises a scatterometer which has multiple gratings at a fixed and/or variable pitch. The scatterometer can be programmed to generate data as it relates to the features being formed by way of directing light and then collecting the reflected light. The light data may be processed and the resulting data can be transmitted to, for example, a control system for the mask fabrication process. The control system for the mask fabrication process may direct adjustments or modifications to be made to the mask fabrication components in order to enhance the overall process. That is, the resulting data is fed back to the mask fabrication process in order to optimize fabrication of the current EUV mask. Alternatively or in addition the data may be fed forward in order to affect the fabrication processes for future EUV masks.

One aspect of the present invention relates to a system for monitoring in-situ an EUV mask fabrication process. The system includes an EUV mask fabrication system comprising a photoresist processor for forming, irradiating and developing a photoresist layer over a translucent substrate having one or more layers of reflective material formed therebetween, the photoresist being the upper most layer, and one or more reflective material etchants for etching the reflective material layers; a mask inspection system operatively connected to the mask fabrication system for examining the layers as they are being etched and developed by the mask fabrication system and generating data related thereto; and an EUV mask fabrication control system coupled to the mask inspection system for receiving data from the inspection system in order to regulate the mask fabrication system to facilitate obtaining desired critical dimensions.

Another aspect of the present invention relates to a system for monitoring in-situ an EUV mask fabrication process. The system includes an EUV mask fabrication system comprising a photoresist processor for forming, irradiating and developing a photoresist layer over a translucent silicon substrate having one or more layers of reflective material formed therebetween, the photoresist being the upper most layer; one or more reflective material etchants for etching the reflective material layers; and one or more fabrication components for manufacturing the mask to be used in an EUV photolithography process, the fabrication components corresponding to at least one of layer formation, deposition rate, pressure, temperature, time, flow rate, and plasma type. The system also contains a mask inspection system operatively connected to the mask fabrication system for examining the layers as they are being patterned and developed by the mask fabrication system; and a control system coupled to the mask inspection system for receiving data from the inspection system in order to regulate the mask fabrication system to facilitate obtaining desired critical dimensions, wherein the control system is operatively connected to the one or more mask fabrication components such that at least one of data, information, and instruction is communicated to the fabrication components in order to effectuate an improvement in the EUV mask fabrication process.

Yet another aspect of the present invention relates to a method for controlling an EUV mask fabrication process in-situ. The method involves providing a silicon substrate having one or more reflective material layers formed thereon; forming a patterned photoresist layer over the one or more reflective material layers; etching one or more features through one or more openings of the patterned photoresist layer into the one or more reflective material layers to form an EUV mask; monitoring the etching of the one or more features via an optical measurement system; generating data related to the one or more features being etched; and relaying the generated data to an EUV mask fabrication control system in order to optimize the EUV mask fabrication process.

DISCLOSURE OF INVENTION

Figure 1:
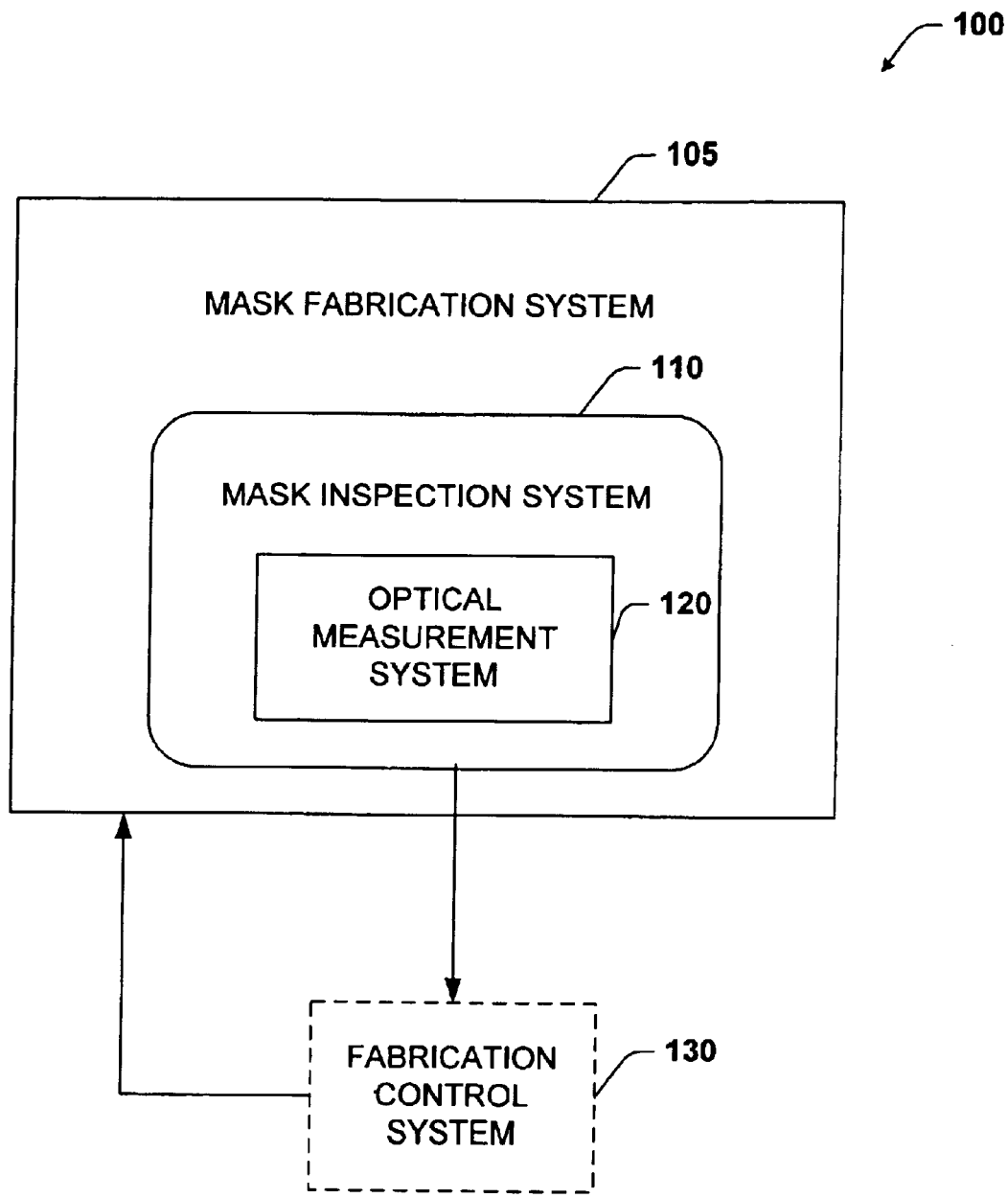
FIG. 1 illustrates a high-level block diagram of a system for controlling in-situ an EUV mask fabrication process according to one aspect of the present invention.

The present invention involves a system and method for using an optical measurement system as a control tool in the fabrication of EUV masks for use in EUV photolithography. In particular, the present invention provides a system and method for monitoring an EUV mask fabrication process in order to optimize the fabrication process for the current EUV mask being made as well as for future EUV mask fabrication. Monitoring the EUV mask fabrication process is accomplished in part by an optical measurement system. The optical measurement system may comprise a scatterometer having multiple gratings positioned at a fixed and/or variable pitch. The multiple gratings on the scatterometer assist in the ability to accurately and substantially measure dimensions of the features, which are formed on and as part of the EUV mask, regardless of their size, placement, dimension, and/or pitch.

A partially fabricated EUV mask manufactured by an EUV mask fabrication system includes a translucent substrate and intermediate reflective material layers sequentially formed on the substrate. A patterned photoresist layer is the uppermost layer and is formed over the reflective material layers. The patterned photoresist layer contains images of features which are to be transferred to the underlying reflective material layers during an etch process (or a series of etch processes) in order to yield a substantially completed EUV mask. The EUV mask can be employed later in an EUV photolithography process.

The EUV mask fabrication system may contain a photoresist processor which can include a photoresist applicator, irradiator, and developer for processing the photoresist layer. The EUV mask fabrication system may also include a reflective layer etchant or etchants depending on the number of reflective layers formed beneath the photoresist layer, the number of layers to be etched, and their respective etch selectivities. In addition, the mask fabrication system contains one or more fabrication components which correspond to at least one of layer formation and/or deposition rates, pressure, temperature, time, flow rates, plasma type and the like.

According to one aspect of the present invention, the optical measurement system monitors the EUV mask fabrication process by directing light at the features which are being etched into the underlying reflective material layers. The reflected light is then collected by sensor devices in the optical measurement system in order to generate data about the partially fabricated EUV mask. The reflected light can be correlated to the thickness, size, dimension, pitch, and/or placement of the feature or a portion of the feature being formed during the etch process. Thus, the reflected light data which may include aspects of the directed light is processed in order to "visualize" the appearance and layout of the partially fabricated EUV mask.

The monitoring of the EUV mask may also continue after the EUV mask has been substantially fabricated as a means to verify the dimensions, layer thickness, feature placement and pitch of the features formed in or on the mask.

Information and/or data corresponding to the partially fabricated EUV mask may be generated by a processor located either internally or externally with respect to the optical measurement system. The processor communicates the generated data to an EUV mask fabrication control system in order to effect a modification in the current fabrication process and/or to effect an enhancement or improvement in future EUV mask fabrication processes. In particular, the generated data as it relates to the features being formed on the EUV mask can be used to optimize fabrication of the current EUV mask. The EUV mask may be optimized to the extent feasible in order to improve its performance.

In order to increase the efficiency and accuracy of future EUV mask fabrication, the generated data may also be utilized in order to mitigate any inefficiencies within the mask fabrication components.

The present invention will now be described with respect to FIGS. 1–6 as demonstrated below. It should be appreciated that EUV masks may have more than one reflective material layer formed over the substrate but beneath the photoresist layer. Thus, the reflective material layer illustrated in the Figures below represent at least one and more than one reflective material layer being formed therebetween the substrate and the patterned photoresist layer.

Referring initially to FIG. 1, a system 100 for monitoring an EUV mask fabrication process as the fabrication process takes place is shown according to one aspect of the present invention. The system 100 includes an EUV mask fabrication system 105 which is operable to form an EUV mask having the desired critical dimensions, layer thickness, etc. The mask fabrication system 105 may include a photoresist processor for applying, irradiating, and developing a photoresist layer and a reflective material layer etchant(s) for transferring the photoresist pattern to the underlying layers of reflective material.

The system 100 further comprises a mask inspection system 110 to facilitate obtaining an EUV mask that exhibits specific parameters and dimensions with respect to the features formed thereon. The mask inspection system 10 monitors fabrication of the EUV mask by way of an optical measurement system 120. The optical measurement system includes a scatterometer programmed to measure one or more characteristics of the features on the mask being formed.

The mask inspection system can be integrated into the mask fabrication system 105 as shown such that the mask does not require realignment in order to be properly measured by the optical measurement system 120. Therefore, the monitoring occurs relatively quickly in order to more readily determine whether the mask is being accurately formed according to the desired specifications.

The system 100 also includes a mask fabrication control system 130. Data collected and/or generated by the mask inspection system 120 can be communicated to the mask fabrication control system 130. The fabrication control system 130 may feed information or data relating to the EUV mask being formed in order to optimize the current EUV mask fabrication process. Furthermore, the control system 130 may also feed such data and information forward to optimize the fabrication system 105 for future masks fabrication processes.

Figure 2:
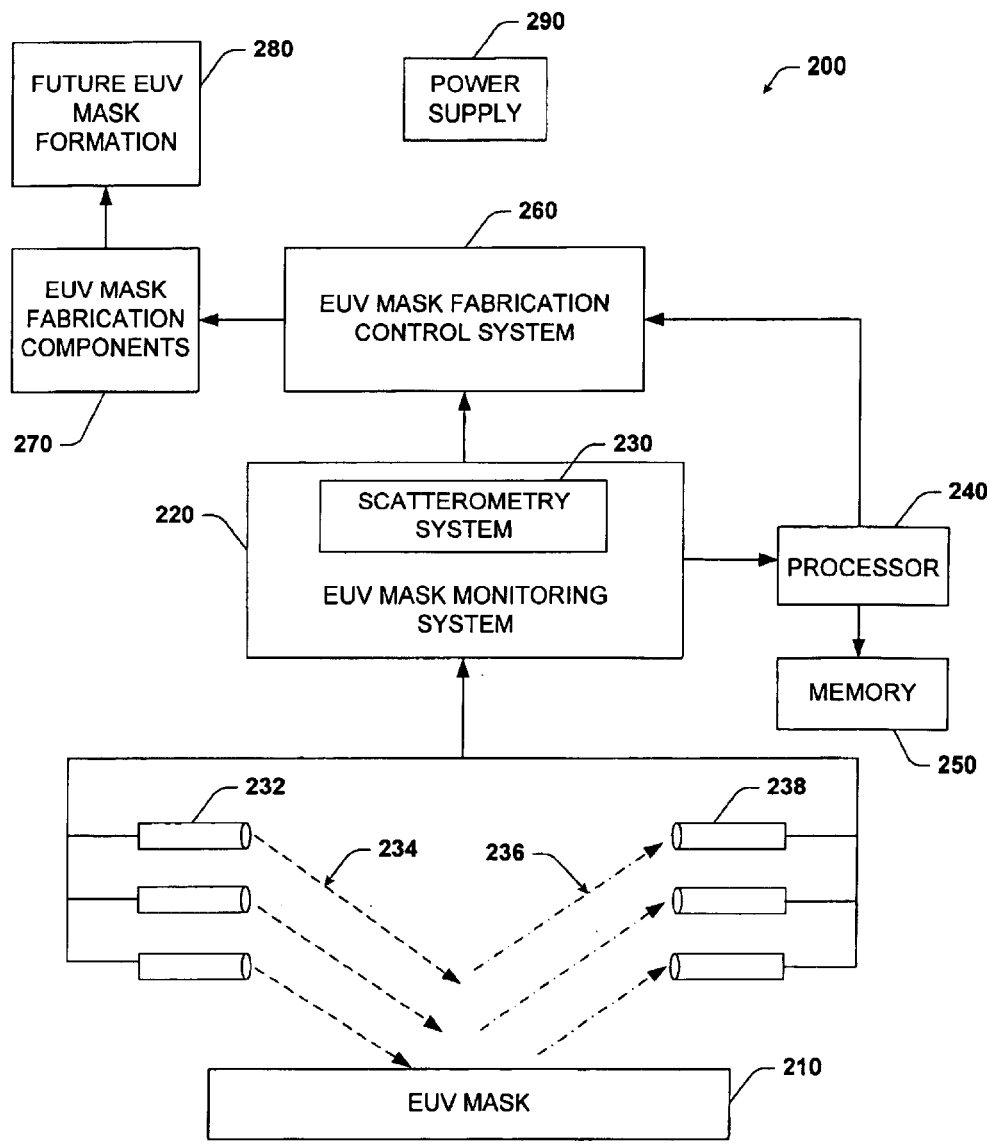
FIG. 2 illustrates a schematic block diagram of a system for controlling in-situ an EUV mask fabrication process via a monitoring system according to one aspect of the present invention.

FIG. 2 illustrates a schematic block diagram of a system 200 for controlling an EUV mask fabrication process. The system 200 includes a partially fabricated EUV mask 210, wherein a patterned photoresist layer is the upper most layer of the mask 210. The EUV mask 210 also includes one or more reflective layers lying beneath the upper most layer.

The partially fabricated mask 210 is positioned for being monitored by an EUV mask monitoring system 220 as it proceeds through the etching and development phases of the EUV mask controlled-fabrication system 200. The monitoring system contains an optical measurement system such as a scatterometer 230 which facilitates the monitoring operation.

The etch process phase involves removing selected portions of the one or more underlying layers in order to form the desired mask features. Formation of the desired features collectively create the end product EUV mask. The system 200 may be employed to monitor at least a portion of the mask 210 during and after the fabrication process has been completed.

In addition, the system 200 includes a light source 232 which transmits one or more beams of incident light 234 at the mask 210 in order to generate a light scattering signature of the surface of the mask 210. The light scattering signature is a form of data which can be used to determine the dimensions, layer thickness, pitch, and the like of the features being formed on the mask 210. Examples of light sources contemplated by the present invention include but are not limited to a laser such as a laser diode or a neon gas laser.

Reflected light 236 from the surface of the mask 210 are received by one or more light receptors 238 in order to generate the light scattering signature of the mask 210. One or more receptors may be used, examples of which include photo diodes and photo detectors. The incident light 234 and reflected light 236 are communicated to the EUV mask monitoring system 220.

The EUV mask monitoring system 220 and/or a processor 240 analyzes the incident light 234 and the reflected light 236. The analysis may be performed in conjunction with the scatterometer 230 in order to interpret the light information for the purpose of generating a light scattering signature corresponding to the feature dimensions, pitch and thickness. A spectroscopic ellipsometer may also be used to interpret the light information and is contemplated to fall within the scope of the present invention.

The generated light scattering signature characterizes the "appearance" of the mask 210, particularly the etched layer or layers in order to determine the surface and feature integrity with respect to the mask 210. The generated light scattering signatures can be recorded and/or stored in a memory 250. The memory 250 may also contain the corresponding incident light 234 and reflected light 236 information. The memory 250 may be internal or external to the processor 240 and may also be used for storing information, data, and/or measurements corresponding to the current mask 210 as well as previously processed and future EUV masks.

In addition, the monitoring system 220 may be coupled to one or a plurality of processors 240, such as the AMD K7®, and/or similar and compatible processing units. The manner in which the monitoring system 220 can be programmed to carry out the present invention should be readily apparent to those having ordinary skill in the art based on the description provided herein.

The system 200 may also provide feed-back and feed-forward control to the mask fabrication system and process. More specifically, the system 200 can be operatively coupled to or contained within the mask fabrication system 100 (FIG. 1) to feed data as it relates to the mask 210 to an EUV mask fabrication control system 260. For example, the EUV mask monitoring system 220 provides information to facilitate modifying one or more fabrication components 270 in order to optimize the fabrication process for the current mask 210. The determined deficiencies or inefficiencies concerning the mask 210 are communicated to the mask fabrication control system 260, where modifications and/or enhancements to the one or more mask fabrication components 270 can be implemented for the current mask and/or a future mask.

In addition, the information and/or data may be fed forward to one or more subsequent mask fabrication processes 280, where the deficiencies or inefficiencies of the current fabrication process may negatively affect the formation of features on future masks if left unchanged. Moreover, the feedback and feed-forward control provided by the system 200 facilitates achieving desired mask formation in a controlled manner.

Finally, a suitable power supply 290 is employed such as a battery, electrical input, and the like in order to operate the system 200 efficiently.

Figure 3:
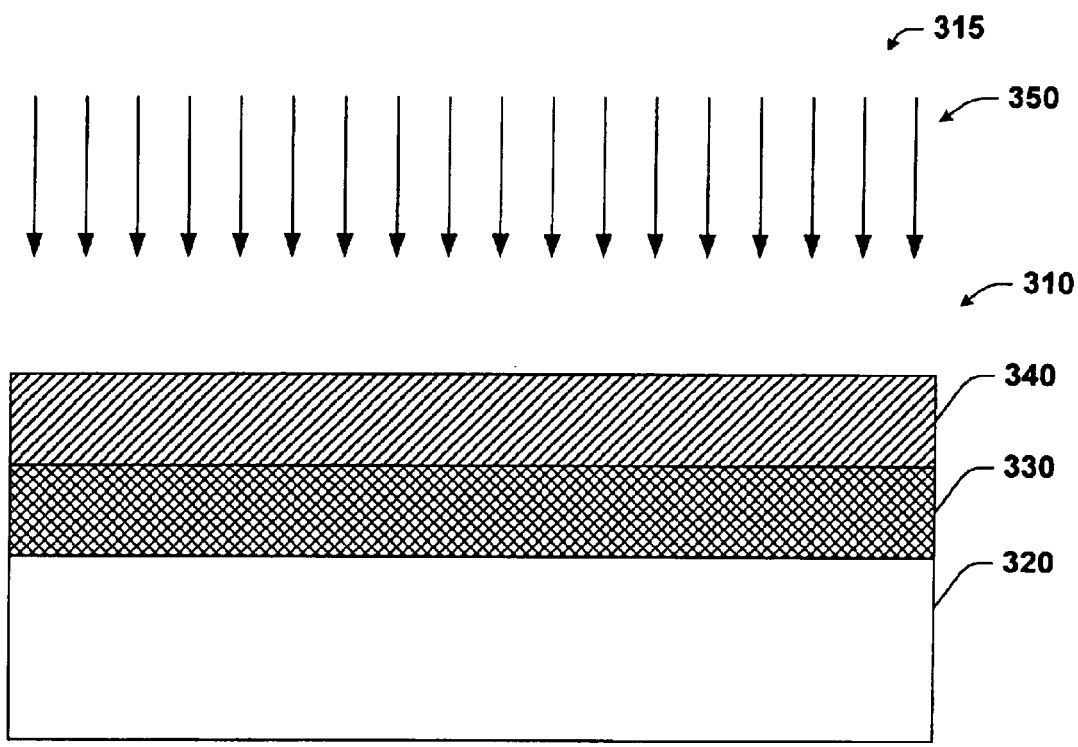
FIG. 3 illustrates a schematic cross-sectional view of the fabrication of an EUV mask as it may appear in an early stage of the fabrication process according to one aspect of the present invention.

Referring now to FIG. 3, a cross-sectional view of a partially fabricated EUV mask 310 undergoing a patterning process 315 is shown. In particular, the partially fabricated EUV mask comprises a silicon substrate 320, one or more reflective material layers 330 formed over the substrate 320, and a photoresist layer 340 thereon. Examples of the reflective material layers 330 include chrome, nitride, molybdenum, silicon, and combinations thereof. The photoresist layer 340 is the upper most layer and is being patterned 350 to form one or more openings therein.

Figure 4:
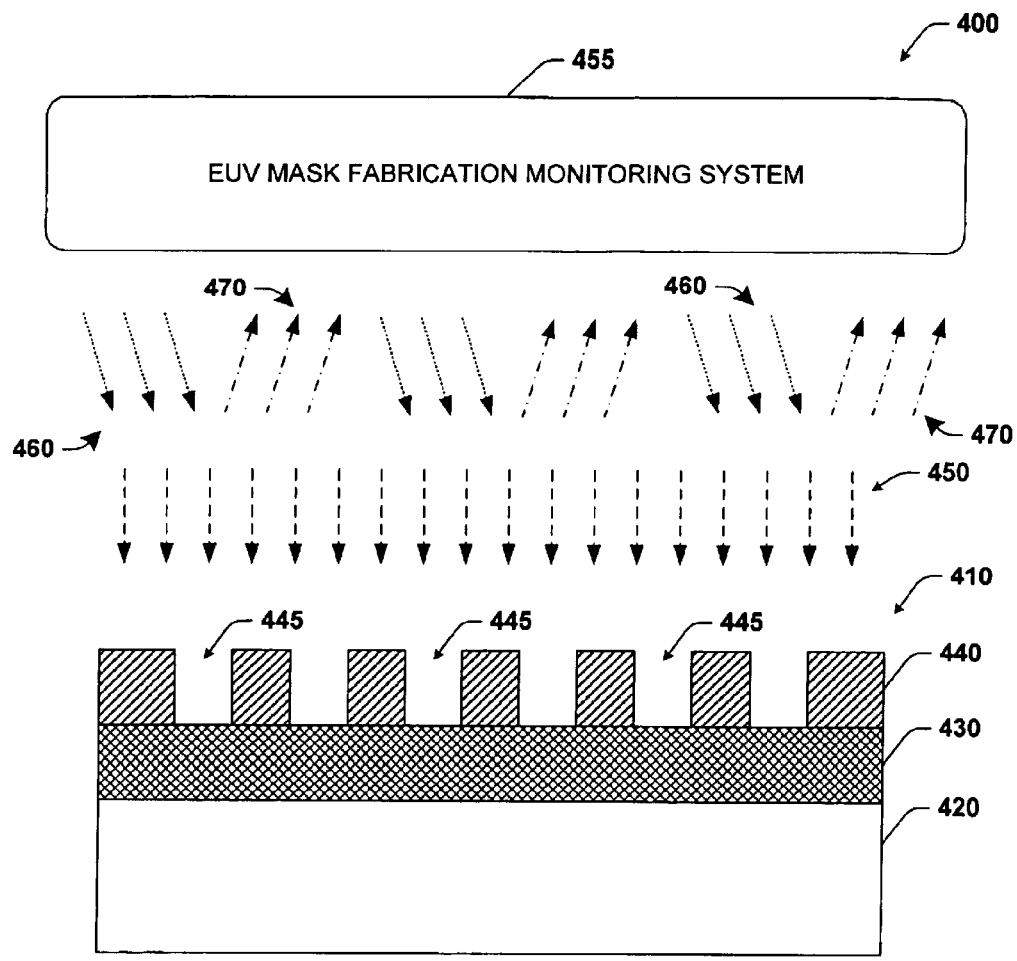
FIG. 4 illustrates a schematic cross-sectional view of the fabrication of the EUV mask of FIG. 3 as it may appear in about the middle stage of the fabrication process and the monitoring therefore according to one aspect of the present invention.

FIG. 4 demonstrates another phase 400 in the mask fabrication system and process. A partially fabricated EUV mask structure 410 is similar in some respects to the mask of FIG. 3. For example, the mask structure 410 comprises a silicon substrate 420 and one or more reflective material layers 430 formed over the substrate 420. Although only one reflective material layer is shown in the mask structure 410, it should be appreciated that more than one layer of reflective material may be formed over the substrate 420.

A patterned photoresist layer 440 is formed over the one or more reflective material layers 430. The patterned photoresist layer 440 includes portions 445 of the photoresist layer 440 which have been removed during a patterning process (FIG. 3). These portions 445 correspond to features which are to be formed in the underlying reflective material layers 430 in order to complete the fabrication of the EUV mask. This formation may be accomplished in part by an etch process 450 or a series of etch processes depending on the etchants and solutions employed as well as the etch selectivities of the reflective material layers 430.

As portions of the reflective material layer 430 are etched (450), an EUV mask fabrication monitoring system 455 similar to the monitoring system 220 described in detail in FIG. 2 above, is employed to monitor the progress of the fabrication process. More specifically, the EUV mask fabrication monitoring system 455 can be employed in order to control the EUV mask fabrication process. Thus, the desired mask structure can be more readily obtained. Monitoring the fabrication process, and the etch process in particular, can be performed by measuring at least one of depth, height, width, pitch, and thickness of the features being formed using a scatterometer, for example. The scatterometer directs light 460 over at least a portion of the features being formed and the reflected light 470 can be gathered for processing and analysis. It should be appreciated that either the mask structure 410 or the monitoring system 455 may be mobile in order to perform the light analysis of the mask 410.

It should also be appreciated that the monitoring system may be integrated onto the fabrication system responsible for manufacturing the mask 410 such that the mask 410 need not be removed, repositioned, and/or realigned in order for the monitoring to occur.

Figure 5:
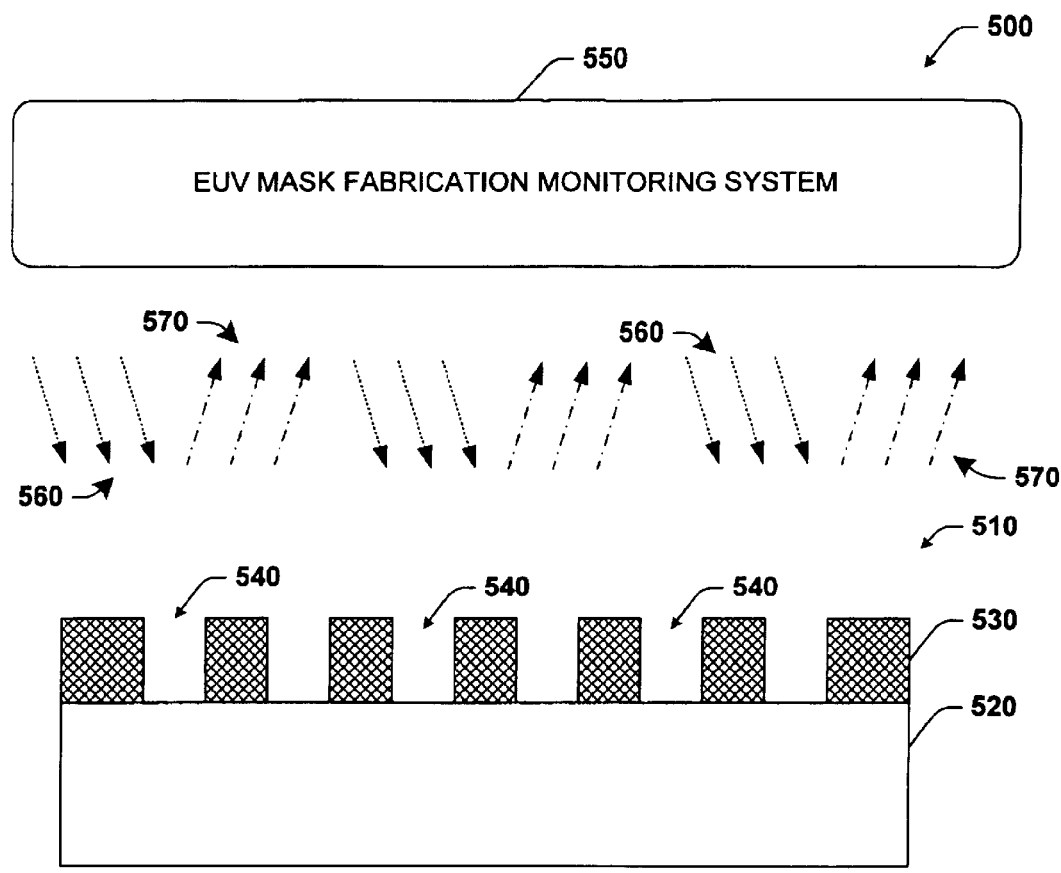
FIG. 5 illustrates a schematic cross-sectional view of the fabrication of the EUV mask of FIG. 4 as it may appear in about the end stage of the fabrication process and the monitoring therefore according to one aspect of the present invention.

FIG. 5 depicts yet another phase 500 in the mask fabrication system and process in accordance with an aspect of the present invention. An EUV mask structure 510 includes a substrate 520 and an etched reflective material layer 530 formed there over. The reflective material layer 530 has undergone etch and development processes in order to form one or more features 540, whereby the features 540 exhibit the desired critical dimensions as well as the appropriate placement and pitch on the mask as specified by a user.

As previously discussed, the mask fabrication monitoring system 455 (FIG. 4) examines the fabrication process in order to control the fabrication process itself as well as the fabrication components employed to make the features. The collected and/or processed information can be fed back into the EUV mask fabrication system. As a result, enhancements may be made to one or more fabrication components in order to optimize the current fabrication process as well as the appearance and performance of the resulting mask. In order to verify that the desired feature dimensions are achieved, the etched reflective material layer 530 may be screened again by a scatterometer.

Figure 6:
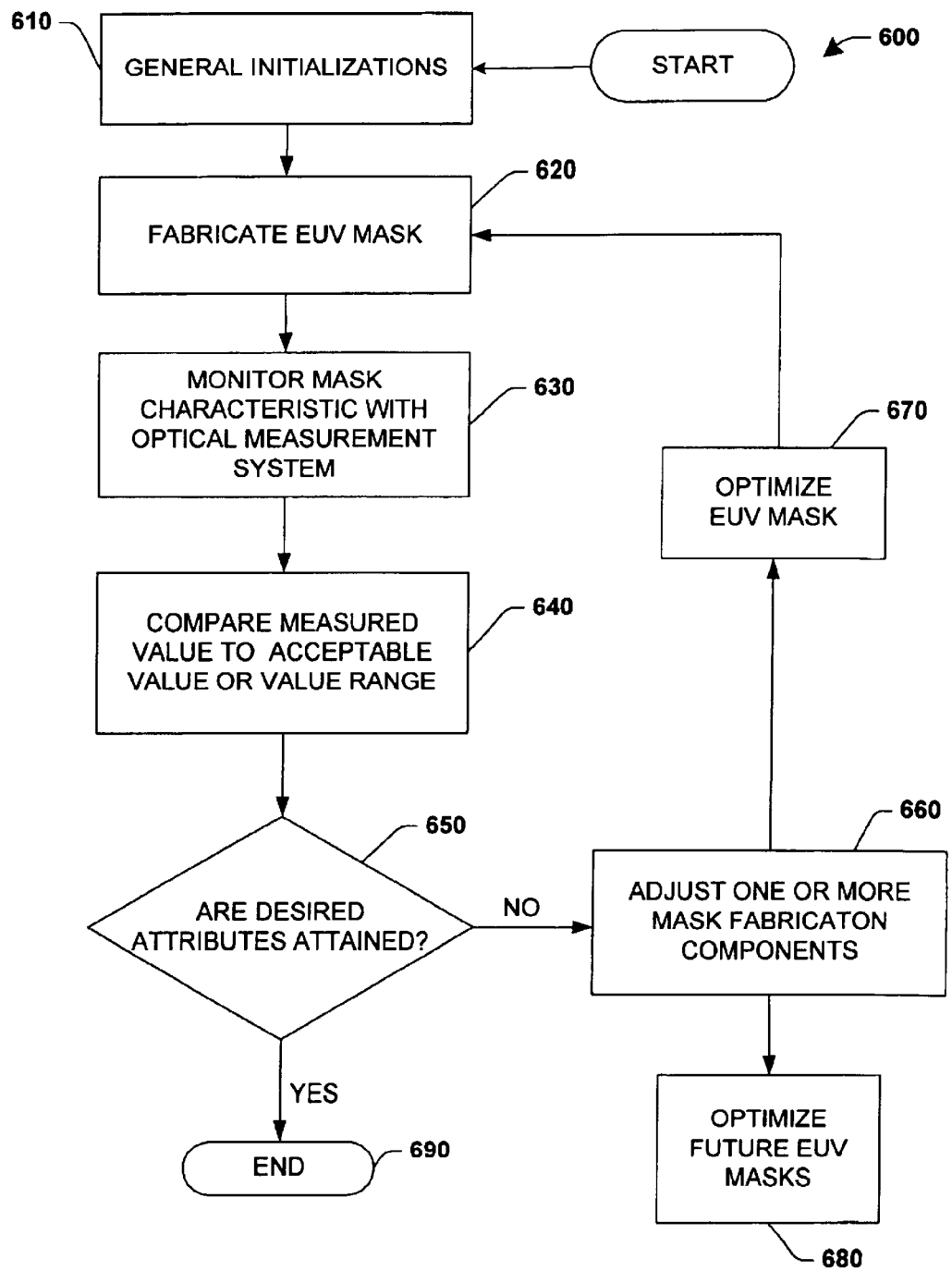
FIG. 6 illustrates a flow diagram of an exemplary method for controlling and optimizing an EUV mask fabrication process according to one aspect of the present invention.

Referring now to FIG. 6, a schematic flow diagram of an exemplary method 600 for controlling an EUV mask fabrication process according to one aspect of the present invention is illustrated. The method may begin with general fabrication initializations which may include preparing a silicon wafer to undergo an EUV mask fabrication process at 610.

At about 620, an EUV mask may be fabricated. Fabrication of the EUV mask involves providing a silicon substrate and depositing one or more reflective material layers onto the substrate. A patterned photoresist layer having a suitable thickness can be formed over the reflective material layers such that the photoresist layer is the upper most layer. The patterned photoresist layer is exposed to one or more etchants. As a result, portions of the underlying reflective material layer which are exposed to the etchant through one or more openings of the patterned photoresist layer are removed in order to form features in the reflective material layer(s).

During the formation of the features, a monitoring system may watch, screen and/or examine characteristics of the features being formed (630). Examples of such characteristics include layer thickness, feature height, width, depth, pitch and placement. The monitoring may be accomplished in part by measuring the surface and/or features of the mask using a scatterometer or other suitable optical device. The measurements can be collected, processed and analyzed in order to determine whether the current fabrication process can be improved or enhanced. One type of analysis involves comparing the measurements to acceptable values or value ranges (640).

Following at 650, it can be ascertained whether desired dimensions have been obtained. If it is determined that the fabrication can be further improved, then adjustments can be made to the one or more fabrication components at 660. At about this point, the adjustments may be implemented to improve the current mask (670) and/or fed forward to optimize the fabrication of future EUV masks (680). However, if it is determined that the fabrication process does not require further improvements to achieve the desired feature dimensions, the monitoring process ends at 690 and fabrication of the mask is completed using the current settings of the fabrication components.

Although the invention has been shown and described with respect to several aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e. that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for monitoring an EUV mask fabrication process comprising:
    an EUV mask fabrication system comprising a photoresist processor for forming, irradiating and developing a photoresist layer over a translucent substrate having one or more layers of reflective material formed therebetween, the photoresist being the upper most layer, and one or more reflective material etchants for etching the reflective material layers;
    a mask inspection system operatively connected to the mask fabrication system that examines the layers as they are being etched and developed by the mask fabrication system and generating data related thereto; and
    an EUV mask fabrication control system coupled to the mask inspection system that receives data from the inspection system in order to regulate the mask fabrication system to facilitate obtaining desired critical dimensions on a newly fabricated mask.

2. The system of claim 1, further comprising one or more mask fabrication components connected to the control system such that at least one of data, information, and instruction is received from the control system in order to effectuate an improvement in the mask fabrication components to obtain desired critical dimensions on a fabricated mask, wherein the fabrication components correspond to at least one of layer formation, deposition rate, pressure, temperature, time, flow rate, and plasma type.

3. The system of claim 1, wherein the mask inspection system provides feedback data to the control system related to one or more images patterned and developed on the layers to facilitate mask fabrication.

4. The system of claim 1, wherein the mask inspection system provides feed-forward data related to data generated by the mask inspection system in order to control the EUV mask fabrication process for future EUV masks.

5. The system of claim 1, wherein the mask inspection system comprises an optical measurement system, the optical measurement system comprising a scatterometer having multiple gratings at fixed and variable pitches.

6. The system of claim 1, further comprises a processor operatively connected to the mask inspection system and the control system for analyzing data gathered by the mask inspection system and for communicating with the control system.

7. The system of claim 1, wherein the one or more layers comprises chrome, titanium nitride, molybdenum, silicon, silicon nitride, and combinations thereof.

8. The system of claim 1, wherein the generated data relates to any one of layer thickness, feature depth, feature height, feature width, feature placement, and pitch.

9. A system for monitoring in-situ an EUV mask fabrication process comprising:
    an EUV mask fabrication system comprising:
        a photoresist processor for forming, irradiating and developing a photoresist layer over a translucent silicon substrate having one or more layers of reflective material formed therebetween, the photoresist being the upper most layer;
        one or more reflective material etchants that etch the reflective material layers; and
        one or more fabrication components for manufacturing the mask to be used in an EUV photolithography process, the fabrication components corresponding to at least one of layer formation, deposition rate, pressure, temperature, time, flow rate, and plasma type;
    a mask inspection system operatively connected to the mask fabrication system that examine the layers as they are being patterned and developed by the mask fabrication system; and
    a control system coupled to the mask inspection system that receives data from the inspection system in order to regulate the mask fabrication system to facilitate obtaining desired critical dimensions,
    wherein the control system is operatively connected to the one or more mask fabrication components such that at least one of data, information, and instruction is communicated to the fabrication components in order to effectuate an improvement in the EUV mask fabrication process.

10. The system of claim 9, wherein the mask inspection system provides feedback to the control system related to one or more images patterned and developed on the layers to facilitate mask fabrication.

11. The system of claim 9, wherein the mask inspection system provides feed-forward data related to data generated by the mask inspection system in order to control the EUV mask fabrication process for future EUV masks.

12. The system of claim 9, wherein the mask inspection system comprises an optical measurement system, the optical measurement system comprising a scatterometer having multiple gratings at fixed and variable pitches.

13. The system of claim 9, wherein the one or more layers comprises chrome, titanium nitride, molybdenum, silicon, silicon nitride, and combinations thereof.

14. The system of claim 9, wherein the generated data relates to any one of layer thickness, feature depth, feature height, feature width, feature placement, and pitch.

15. A method for controlling an EUV mask fabrication process in-situ comprising:
    providing a silicon substrate having one or more reflective material layers formed thereon;
    forming a patterned photoresist layer over the one or more reflective material layers;
    etching one or more features through one or more openings of the patterned photoresist layer into the one or more reflective material layers to form an EUV mask;
    monitoring the etching of the one or more features via an optical measurement system;
    generating data related to the one or more features being etched; and
    relaying the generated data to an EUV mask fabrication control system in order to optimize the EUV mask fabrication process.

16. The method of claim 15, further comprising feeding data corresponding to the features formed in the reflective material layers back to the mask fabrication process so as to effect an improvement in one or more mask fabrication components in order to optimize fabrication of the EUV mask.

17. The method of claim 16, wherein the one or more mask fabrication components correspond to at least one of layer formation, deposition rates, pressure, temperature, time, flow rates, and plasma type.

18. The method of claim 15, further comprising feeding data corresponding to the features formed in the reflective material layers forward to optimize fabrication of future EUV masks.

19. The method of claim 15, further comprising processing data generated via the measurement system into information usable and recognizable by the control system.

20. The method of claim 15, wherein monitoring the etching of the one or more features comprises using the optical measurement system to measure one or more characteristics of the features to determine whether the EUV mask is being formed with the desired dimensions and accuracy.

21. The method of claim 20, wherein one or more characteristics of the features comprises reflective material layer thickness, feature depth, feature height, feature width, feature placement, and pitch.

22. The method of claim 15, wherein the optical measurement system comprises a scatterometer having multiple gratings at fixed and variable pitches.

* * * * *